United States Patent [19]

Straayer

[11] Patent Number: 5,163,128
[45] Date of Patent: Nov. 10, 1992

[54] METHOD AND APPARATUS FOR GENERATING A MULTIPLE TOLERANCE, THREE STATE DATA BASE FOR USE WITH AUTOMATIC OPTICAL INSPECTION SYSTEMS

[75] Inventor: Ronald J. Straayer, South Windsor, Conn.

[73] Assignee: Gerber Systems Corporation, South Windsor, Conn.

[21] Appl. No.: 558,745

[22] Filed: Jul. 27, 1990

[51] Int. Cl.$^5$ .............................. G06F 15/62
[52] U.S. Cl. ...................... 395/129; 382/8; 382/1; 358/106; 358/101
[58] Field of Search ............ 364/518, 521; 340/747; 382/1, 8; 358/101, 106; 395/129, 130, 132

[56] References Cited

U.S. PATENT DOCUMENTS

| | | | |
|---|---|---|---|
| 4,578,810 | 3/1986 | MacFarlane et al. | 382/8 |
| 4,783,826 | 11/1988 | Koso | 382/8 |
| 4,859,999 | 8/1989 | Koso | 340/799 |
| 4,941,182 | 7/1990 | Patel | 382/1 |

Primary Examiner—Gary V. Harkcom
Assistant Examiner—Phu K. Nguyen
Attorney, Agent, or Firm—McCormick, Paulding & Huber

[57] ABSTRACT

A method and apparatus used with a printed circuit board (PCB) defect detection system generates a reference data base image of the PCB having tolerances for each individual PCB feature. The invention includes a transitional data base having three states, black, white and gray corresponding to areas where the PCB features respectively must appear, must not appear and may or may not appear.

10 Claims, 3 Drawing Sheets

METHOD AND APPARATUS FOR GENERATING A MULTIPLE TOLERANCE, THREE STATE DATA BASE FOR USE WITH AUTOMATIC OPTICAL INSPECTION SYSTEMS

TECHNICAL FIELD

This invention relates to defect detection systems used with the production of printed circuit boards (PCB), and more particularly to a system which creates a transition data base (TDB) containing tolerance information of PCB patterns used in defect inspection of fabricated printed circuit boards wherein each feature maybe individually toleranced.

BACKGROUND OF THE INVENTION

Printed circuit boards are today manufactured by a process which is almost completely automated. The circuits for a particular printed circuit board are generated using a computer aided design (CAD) machine which will not only generate a schematic of the printed circuit board but also will provide the board layout for all of the devices thereon. The printed circuit board layout information is provided to a device such as a laser plotter which exposes the artwork needed to fabricate the printed circuit board. The artwork comprises a series of transparent and opaque areas as features corresponding to the PCB devices.

However, defects may be present in the printed circuit board or the PCB artwork which would render the printed circuit board useless. It is therefore desirable to have a reference against which the artwork or the printed circuit board can be compared. These defects can have a variety of causes, including shrinkage in the artwork or failures in the fabrication process. Known systems for defect detection in printed circuit boards have often simply compared a given printed circuit board against a reference, defect free printed circuit board (i.e. golden board) to detect errors created during the fabrication process. However, this simple comparison will yield a large number of exceedingly minor defects which do not render the board unacceptable. Moreover, global changes to the features of the board caused by shrinkage of the artwork would result in all of the features being detected as defects in a system based upon a simple comparison to a golden board.

Some known optical PCB inspection systems are configured to examine inspection marks which are placed on the artwork away from the features. The dimensions of the registration marks on the printed circuit board are compared against a reference to determine the extent of shrinkage. Should the shrinkage exceed a certain magnitude, the board is considered to be defective.

The information corresponding to the features for the printed circuit board is digitized and stored on a magnetic medium, such as a magnetic tape. However, the sheer size of a resulting raster (X,Y) data file or data base requires that the data be compressed to reduce the storage volume and increase the speed of processing. A variety of compressed data base formats are found in the art, including run length encoded (RLE) format and scan line update (SLU), a format used by such companies as the American Telephone and Telegraph Company (AT&T).

In order to create an image of the PCB features, the CAD data must be translated into raster format and provided to a laser direct imager (LDI) such as the LDI 9720 or 9725 marketed by The Gerber Scientific Instrument Company, the assignee of the present invention. The comparison of devices on the printed circuit board and features on the reference image is performed by a device such as the model 1850 defect detection system also marketed by The Gerber Scientific Instrument Company.

A technique for generating a three state transitional data base (TDB) is disclosed and claimed in the commonly owned and co-pending U.S. patent application Ser. No. 508,093 entitled "A Method and Apparatus For Providing A Three State Data Base for Use With Automatic Optical Inspection Systems", incorporated herein by reference. That technique is characterized by an algorithm which creates from a two state data base a three state (black, white, gray) TDB with each feature having a single, uniform tolerance.

It would be advantageous to have a method and apparatus for creating a data base from the original CAD data for use in defect detection of printed circuit boards which would provide the capability of different tolerances for different individual printed circuit board features. The present invention is directed towards such a method and apparatus.

SUMMARY OF INVENTION

An object of the present invention is to provide a method and apparatus for use with printed circuit board automatic optical inspection systems which generates a data base having the capability of different tolerances for different printed circuit board features.

Another object of the present invention is to provide for a method and apparatus of the foregoing type which is characterized by a three state data base.

According to the present invention, a method of generating a toleranced data base from a nominal data base of signals indicative of an image of printed circuit board (PCB) artwork features each having nominal dimensions, the data bases comprised of an array of pixels having either a first state (black) or a second state (white), with the black state pixels corresponding to the PCB features including the steps of generating a data base having signals corresponding to at least one set of minimum and maximum tolerance values for at least a selected one of the PCB features; providing a minimum data base from the nominal and the tolerance value data bases such that the selected PCB feature nominal dimensions are reduced by the minimum tolerance value; providing a maximum data base from the nominal and the tolerance value data bases such that the selected PCB feature nominal dimensions are increased by the maximum tolerance value. Also included are the steps of comparing the state of each of the pixels in the minimum and maximum data bases; generating the signals of the toleranced data base in accordance with the comparison, providing a black state pixel if both of the minimum and maximum pixel states are black, providing a white state pixel if both of said minimum and maximum pixel states are white, providing a gray state pixel if the minimum and maximum pixels are of different pixel states.

DESCRIPTION OF THE PREFERRED EMBODIMENT

Figure 1:
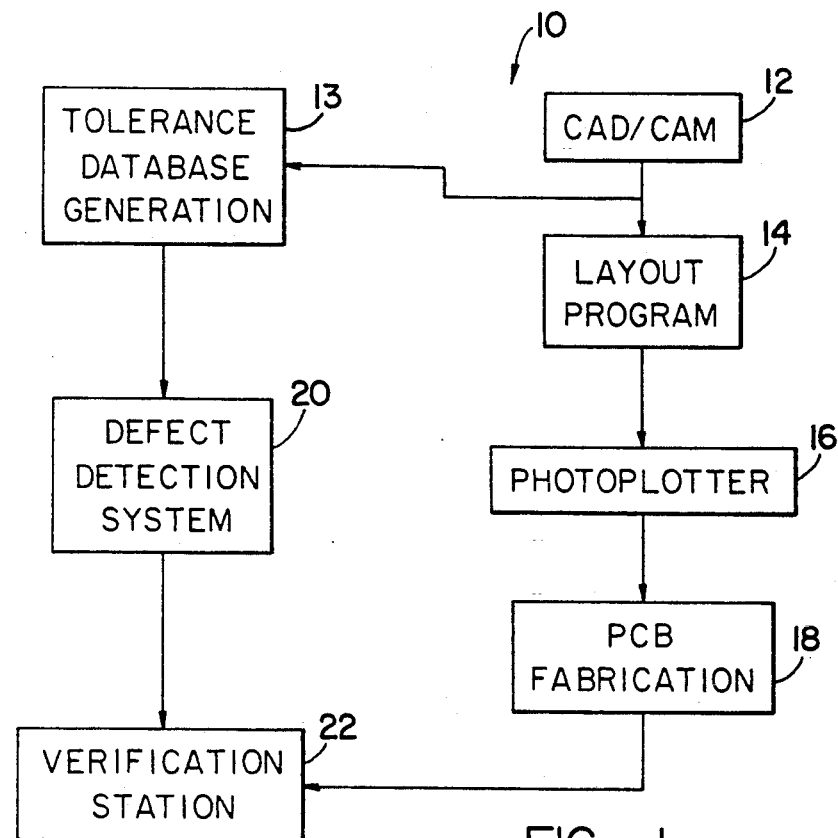
FIG. 1 is a simplified schematic drawing illustrating several devices used in the fabrication of a printed circuit board.

Referring now to FIG. 1 there is shown in simplified schematic form a series of devices representative of a system 10 used in the fabrication of a printed circuit board. Typically, the circuits to be fabricated on the printed circuit board (PCB) are generated using a CAD/CAM apparatus (block 12) which generates a data file containing a schematic of the layout of the PCB circuits. The circuits are configured as geometric features in the CAD/CAM data file. These features are comprised of a series of primitives such as circles, triangles, rectangles, etc. Each feature is created from the original CAD data by interpreting the CAD data commands to "flash" or "draw" in conjunction with the CAD data apertures. A "flash" command places an aperture in a single location while a draw command moves an aperture from a start to a stop position filling in along the way.

At block 14 this data file is input to a processor which generates the physical layout for the printed circuit board. The size of the corresponding data file is quite large, so most systems will use one of several known techniques to compress the data. These techniques include a variety of run length encoded formats or a scan line update (SLU) format such as the AT&T format referenced above. This data file is then provided to a series of devices, including a photoplotter 16 used to fabricate the artwork necessary to make the printed circuit board. The photoplotter is typically a laser direct imager (LDI). The LDI moves the exposing laser beam scanning spot with respect to a write platen and modulates the beam off and on as commanded by the input data. After the line is drawn, the platen is moved by an amount equal to the resolution (i.e. $\frac{1}{2}$ mil) and the next line is drawn. The process continues until the entire image is exposed on to the film. For a full sized PCB image there will be 52,000 scans each consisting of 40,800 bits, 5000 bytes or 2500, 16 bit words. Lastly, at block 18 the printed circuit board is fabricated using known equipment.

In order to test the printed circuit board for defects, a toleranced version of the CAD data in the form of a compressed data file is also provided to a printed circuit board defect detection system 20, such as the model 1850 defect detection system referenced above. As detailed hereinafter, the model 1850 will decompress the (3 state per pixel) data back to raster format to generate a reference image of the printed circuit board. This image can then be used to compare against a scanned image of the printed circuit board to locate defects which can subsequently be verified at verification station 22.

Figure 2:
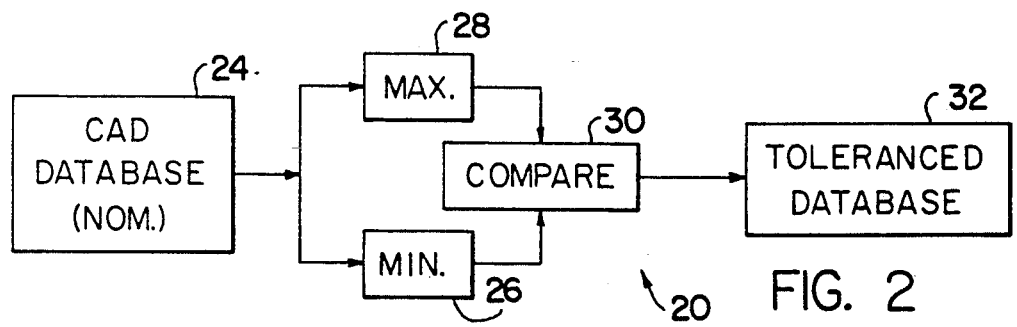
FIG. 2 is a simplified illustration of the operation of a defect detection system provided according to the present invention.

Referring now to FIG. 2, there is shown a simplified illustration of the operation of a defect detection system 20 provided according to the present invention. In sum, the system receives CAD data corresponding to the original design of nominally dimensioned PCB features (block 24). Two data bases are created therefrom corresponding to PCB features with the maximum and minimum allowable dimensions, respectively (blocks 26, 28). These data bases are compared at block 30 and a toleranced, three state data base is generated at block 32.

Figure 3:
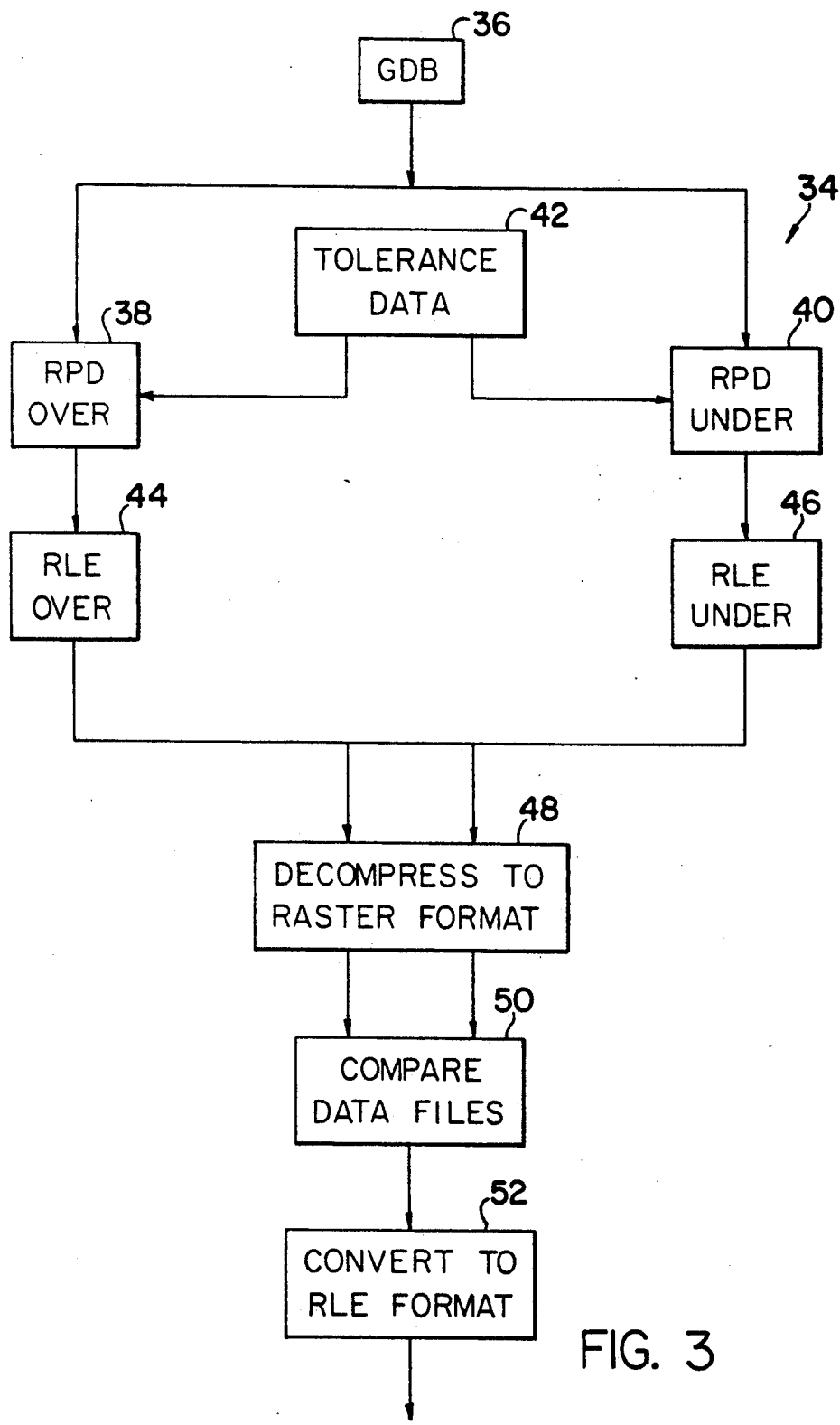
FIG. 3 is a detailed diagrammatic illustration of an algorithm executed by a portion of the defect detection system of FIG. 2.

FIG. 3 is a detailed diagrammatic illustration of an algorithm 34 executed by a portion of the preferred defect detection system 20 provided according to the present invention used to locate errors in printed circuit board or PCB artwork. The system generates a transition data base (TDB) having three state (black, white, gray) RLE data from two state (black, white) RLE data in a manner detailed hereinafter. Note that the three respective states referred to herein, black, white and gray, respectively correspond to locations on the PCB where the feature must appear, must not appear and may or may not appear (don't care). Although the present invention preferably converts two state RLE data into three state RLE data, those skilled in the art will note that two state data in raster format can also be processed into a three state raster data base with appropriate changes in software.

At block 36 data corresponding to the nominal features on a printed circuit board are provided from a CAD system in a Gerber data base (GDB). The PCB features are represented as geometric primitives, as described hereinabove. Two raster plot data bases (RPD) are created at blocks 38, 40 using feature tolerance data provided by a tolerance data file (block 42). With known devices, only a single tolerance value could be specified for every feature in the file. However, a departure of the present invention from the prior art is the capability of the present invention to provide different tolerances for not only different features, but also for individual examples of specific features, should that be desired.

The tolerance data file contains minimum and maximum tolerance values for the PCB features. The RPD data bases are then translated into a 16 bit RLE format (blocks 44, 46) for each of the minimum and maximum tolerance values, preferably The Gerber Scientific Instrument Company 16 bit format characteristic of the model 1850 defect detection system. The data is then decompressed into a raster form (block 48) for each of the minimum and maximum tolerance values. Most computers lack the capacity to hold a large raster image in main memory. For example, an 18"×24" PCB image at 0.5 mil resolution requires more than 200 MB of memory. Consequently, the system converts the RLE image to a hybrid raster format in blocks of scan lines in a manner detailed hereinafter. Each block of scan lines is now described by a list of runs and a block of raster data.

The data tolerating apparatus receives at block 50 the hybrid format RLE data bases and compares one against the other, pixel by pixel. A new data base is generated from this comparison in accordance with the following algorithm.

| DATA BASE | | |
|---|---|---|
| min (undersized) | max (oversized) | toleranced result |
| B | B | B |
| W | W | W |
| B | W | G |

-continued

| DATA BASE | | |
|---|---|---|
| min (undersized) | max (oversized) | toleranced result |
| W | B | G |

Where "B, W, G" correspond to the above reference three pixel states, black, white and gray, respectively. The feature tolerances are represented by the third, gray (or don't care) state. The tolerance data is then recompressed in a known manner to RLE format for use by the system in detecting PCB defects (block 52).

Figure 4:
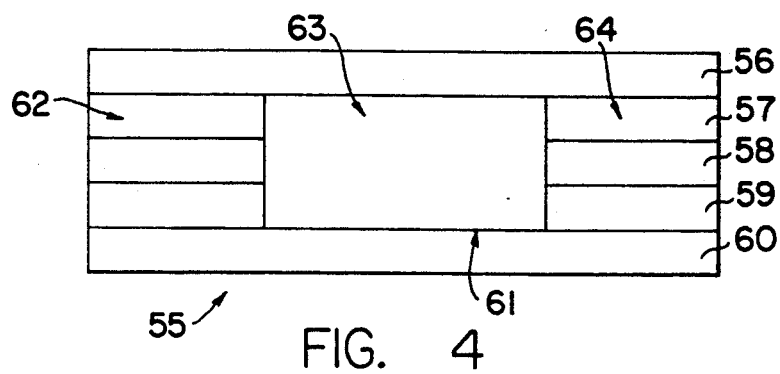
FIG. 4 is a simplified illustration of a sequence of scan lines having a PCB element feature represented as pixels of like color.

Referring now to FIG. 4, there is shown a top view of a portion of a PCB artwork feature 55 representing a device on a printed circuit board. Scan lines 56, 57, 58, 59 and 60 are to be written on the PCB artwork. Each scan line is comprised of a linear array of pixels. Scan line 56 is outside of feature 61 and therefore has all "clear" pixels in the figure or "white" pixels in the data base image. Scan lines 57-59 include the PCB feature and each has white pixels 62 followed by "black" pixels 63 followed by white pixels 64. Scan line 60 is comprised of all white pixels as it is outside of the PCB feature 60.

As noted above, the present invention provides for a transitional data base wherein PCB artwork features in a reference data base are modified to include dimensional tolerances therefor. For the system 20, a global inner/outer feature tolerance can be predefined in magnitude. However, one important departure of the present invention from the prior art is its capability of providing different tolerances for different features.

Figure 5:
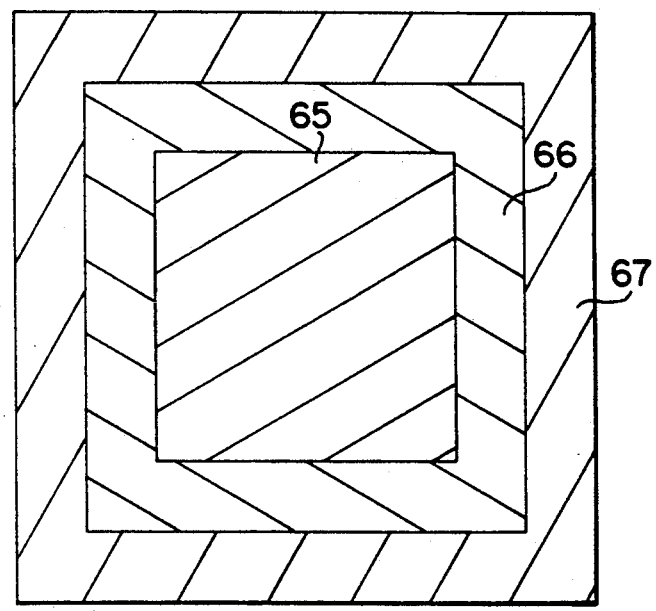
FIG. 5 is an illustration of an image of the PCB feature of FIG. 4 with inner and outer tolerances.

FIG. 5 contains the PCB feature found in FIG. 4 after processing by the present invention using a preselected value of one pixel for a tolerance. Black pixels represent image areas where the pattern must appear, white pixels represent image areas where the pattern must not appear. Gray pixels represent an image area where an appearance or lack of appearance of the pattern (black pixel) is unimportant. These "gray" pixels occur on pattern edges and represent inner/outer tolerances or acceptable pattern variances. In FIG. 5, region 65 corresponds to that portion of the feature which must appear. Region 66 is a nominal area of that feature while region 67 represents the largest area of which that feature may have.

Alternatively, the present invention provides the capability for each feature to be toleranced individually. Therefore, the rectangular feature 55 can be provided with a one pixel tolerance as shown in FIG. 5 while another feature, for example a circle, can be provided with a greater number of gray tolerance pixels. Also, each time the feature is repeated in the PCB artwork it may be generated with a greater number of tolerance pixels. This feature of the present invention is accomplished by accessing the tolerance data found in a data file (42, FIG. 3) for each feature. In the preferred embodiment, the tolerance data file is accessed during the generation of the oversized and undersized RPD data bases. The tolerance value for each feature is expressed as a percent of dimension (X or Y) in look up table form in the preferred embodiment. For example, feature 55 is to be uniformly toleranced by a fixed percentage in both the X and Y dimensions. The preferred algorithm accesses the tolerance data file during the generation of the over and undersized RPD data bases. When a feature is encountered during the generation process, the tolerance data base is interrogated to see what are the tolerance values therefor. Consequently, that feature's dimensions are respectively increased and reduced by the select percentage(s) for the oversized and undersized RPD data bases. The same process is performed for the next (or a subsequent) feature by an amount(s) indicated in the tolerance data file. As stated above, the image is processed in scan line blocks, FIGS. 2 and 3 represent the processing of a block.

Similarly, although the invention has been shown and described with respect to a preferred embodiment thereof, it should be understood by those skilled in the art that various other changes, omissions and additions thereto may be made therein without departing from the spirit and scope of the present invention.

I claim:

1. A method of generating a toleranced data base from an initial data base of signal indicative of an image of printed circuit board (PCB) artwork features each having preferred dimensions, said data bases comprised of an array of pixels having either a first state (black) or a second state (white), with said black state pixels corresponding to said PCB features, said method comprising the steps of:

generating a data base having signals corresponding to at least one set of minimum and maximum tolerance values for at least a selected one of said PCB features;

providing a minimum data base from said initial and said tolerance value data bases such that said selected PCB feature preferred dimensions are reduced by said minimum tolerance value;

providing a maximum data base from said nominal and said tolerance value data bases such that said selected PCB feature nominal dimensions are increased by said maximum tolerance value;

comparing the state of each of the pixels in said minimum and maximum data bases;

generating the signals of the toleranced data base in accordance with said comparison;

providing a black state pixel if both of said minimum and maximum pixel states are black;

providing a white state pixel if both of said minimum and maximum pixel states are white;

providing a gray state pixel if said minimum and maximum pixels are of different pixel states.

2. An apparatus for generating a toleranced data base from an initial data base of signals indicative of an image of printed circuit board (PCB) artwork features each having preferred dimensions, said data bases comprised of an array of pixels having either a first state (black) or a second state (white), with said black state pixels corresponding to said PCB features, said apparatus comprising:

a means for generating a data base having signals corresponding to at least one set of minimum and maximum tolerance values for at least a selected one of said PCB features;

a means for providing a minimum data base from said initial and said tolerance value data bases such that said selected PCB feature preferred dimensions are reduced by said minimum tolerance value;

a means for providing a maximum data base from said initial and said tolerance value data bases such that said selected PCB feature preferred dimensions are increased by said maximum tolerance value;

a means for comparing the state of each of the pixels in said minimum and maximum data bases;

a means for generating the signals of the toleranced data base in accordance with said comparison such that;

a black state pixel is provided if both of said minimum and maximum pixel states are black;

a white state pixel is provided if both of said minimum and maximum pixel states are white;

a gray state pixel is provided if said minimum and maximum pixels are of different pixel states.

3. The apparatus of claim 2 wherein said maximum and minimum tolerance values have the same magnitude.

4. The apparatus of claim 2 wherein said tolerance value data base contains tolerance values for more than one of said PCB features.

5. The apparatus of claim 2 wherein said tolerance value data base contains a single tolerance value for all of said PCB features.

6. The apparatus of claim 2 wherein said preferred data base is configured in a run length encoded format and wherein said apparatus further comprises a means for decompressing said initial data base into a raster format.

7. A system for generating a toleranced data base for use in the fabrication of PCB artwork, said system comprising:

a means for generating an initial data base of signals indicative of an image of printed circuit board (PCB) artwork features each having preferred dimensions, said data bases comprised of an array of pixels having either a first state (black) or a second state (white), with said black state pixels corresponding to said PCB features;

a means for generating a data base having signals corresponding to at least one set of minimum and maximum tolerance values for at least a selected one of said PCB features;

a means for providing a minimum data base from said initial and said tolerance value data bases such that said selected PCB feature preferred dimemsions are reduced by said minimum tolerance value;

a means for providing a maximum data base from said initial and said tolerance value data bases such that said selected PCB feature preferred dimensions are increased by said maximum tolerance value;

a means for comparing the state of each of the pixels in said minimum and maximum data bases; and a means for generating the signals of the toleranced data base in accordance with said comparison such that;

a black state pixel is provided if both of said minimum and maximum pixel states are black;

a white state pixel is provided if both of said minimum and maximum pixel states are white;

a gray state pixel is provided if said minimum and maximum pixels are of different pixel states.

8. The system of claim 7 wherein said initial data base is configured in a run length encoded format, and wherein said system further comprises;

a means for decompressing said initial data base into a raster format; and a means for converting said toleranced data base into said run length encoded format.

9. A method of generating a toleranced data base for use in the fabrication of PCB artwork comprising the steps of:

providing an initial data base of signals indicative of an image of printed circuit board (PCB) artwork features each having preferred dimensions, said data base comprised of an array of pixels having either a first state (black) or a second state (white), with said black state pixels corresponding to said PCB features;

generating a data base having signals corresponding to at least one set of minimum and maximum tolerance values for at least a selected one of said PCB features;

providing a minimum data base from said initial and said tolerance value data bases such that said selected PCB feature preferred dimensions are reduced by said mimimum tolerance value;

providing a maximum data base from said initial and said tolerance value data bases such that said selected PCB feature preferred dimensions are increased by said maximum tolerance value;

comparing the state of each of the pixels in said minimum and maximum data bases;

generating the signals of the toleranced data base in accordance with said comparison;

providing a black state pixel if both of said minimum and maximum pixel states are black;

providing a white state pixel if both of said minimum and maximum pixel states are white;

providing a gray state pixel if said minimum and maximum pixels are of different pixel states.

10. The method of claim 9 wherein said initial data bases is configured in a run length encoded format, and wherein said method further comprises the steps of:

decompressing said initial data base into a raster format; and converting said toleranced data base into said run length encoded format.

* * * * *